(12) United States Patent
Buer

(10) Patent No.: US 8,139,370 B2
(45) Date of Patent: Mar. 20, 2012

(54) ELECTRONIC SYSTEM HAVING FIELD EFFECT TRANSISTORS AND INTERCONNECT BUMPS ON A SEMICONDUCTOR SUBSTRATE

(75) Inventor: Kenneth V. Buer, Gilbert, AZ (US)

(73) Assignee: ViaSat, Inc., Carlsbad, CA (US)

( * ) Notice: Subject to any disclaimer, the term of this patent is extended or adjusted under 35 U.S.C. 154(b) by 390 days.

(21) Appl. No.: 12/409,917

(22) Filed: Mar. 24, 2009

(65) Prior Publication Data

US 2010/0246153 A1   Sep. 30, 2010

(51) Int. Cl.
*H05K 7/10* (2006.01)
(52) U.S. Cl. .................................................. 361/768
(58) Field of Classification Search ........... 361/768–784
See application file for complete search history.

(56) References Cited

U.S. PATENT DOCUMENTS

| | | | |
|---|---|---|---|
| 5,942,957 A | | 8/1999 | Mohwinkel et al. |
| 6,362,689 B1 | | 3/2002 | Buer |
| 6,388,528 B1 | | 5/2002 | Buer et al. |
| 6,774,466 B1 | * | 8/2004 | Kajiwara et al. ............ 257/673 |
| 7,400,002 B2 | * | 7/2008 | Kajiwara et al. ............ 257/288 |
| 7,439,622 B2 | * | 10/2008 | Akamine et al. ............ 257/728 |
| 7,728,442 B2 | * | 6/2010 | Yoshioka et al. ............ 257/780 |
| 2002/0141168 A1 | * | 10/2002 | Tsukahara ............ 361/768 |
| 2004/0070081 A1 | * | 4/2004 | Chien et al. ............ 257/778 |
| 2004/0150082 A1 | * | 8/2004 | Kajiwara et al. ............ 257/678 |
| 2005/0236689 A1 | | 10/2005 | Sugiura et al. |
| 2007/0034946 A1 | | 2/2007 | Akamine et al. |
| 2007/0040249 A1 | * | 2/2007 | Kajiwara et al. ............ 257/673 |
| 2009/0206411 A1 | * | 8/2009 | Koketsu et al. ............ 257/368 |

FOREIGN PATENT DOCUMENTS

| | | |
|---|---|---|
| EP | 0592002 A2 | 4/1994 |
| EP | 0683519 A2 | 11/1995 |
| EP | 1351300 A2 | 10/2003 |

OTHER PUBLICATIONS

The European Search Report from corresponding European Application No. 10156528.1 dated Aug, 27, 2010.

* cited by examiner

*Primary Examiner* — Chandrika Prasad
(74) *Attorney, Agent, or Firm* — Snell & Wilmer L.L.P.

(57) ABSTRACT

A method and system for a FET cell is presented. The FET cell includes multiple individual transistors and interconnect bumps that are configured to flip-chip connect to a substrate. The substrate may have the majority of a matching structure for the FET cell. Furthermore, the FET cell may include a stability circuit in communication with the terminals of the individual transistors and further in communication with the interconnect bumps. Additionally, different materials can be used in combination in the FET cell and the separate substrate having the majority of the matching structure. Various materials may be more efficiency used in a FET cell, while other materials are suitable for the separate substrate.

18 Claims, 5 Drawing Sheets

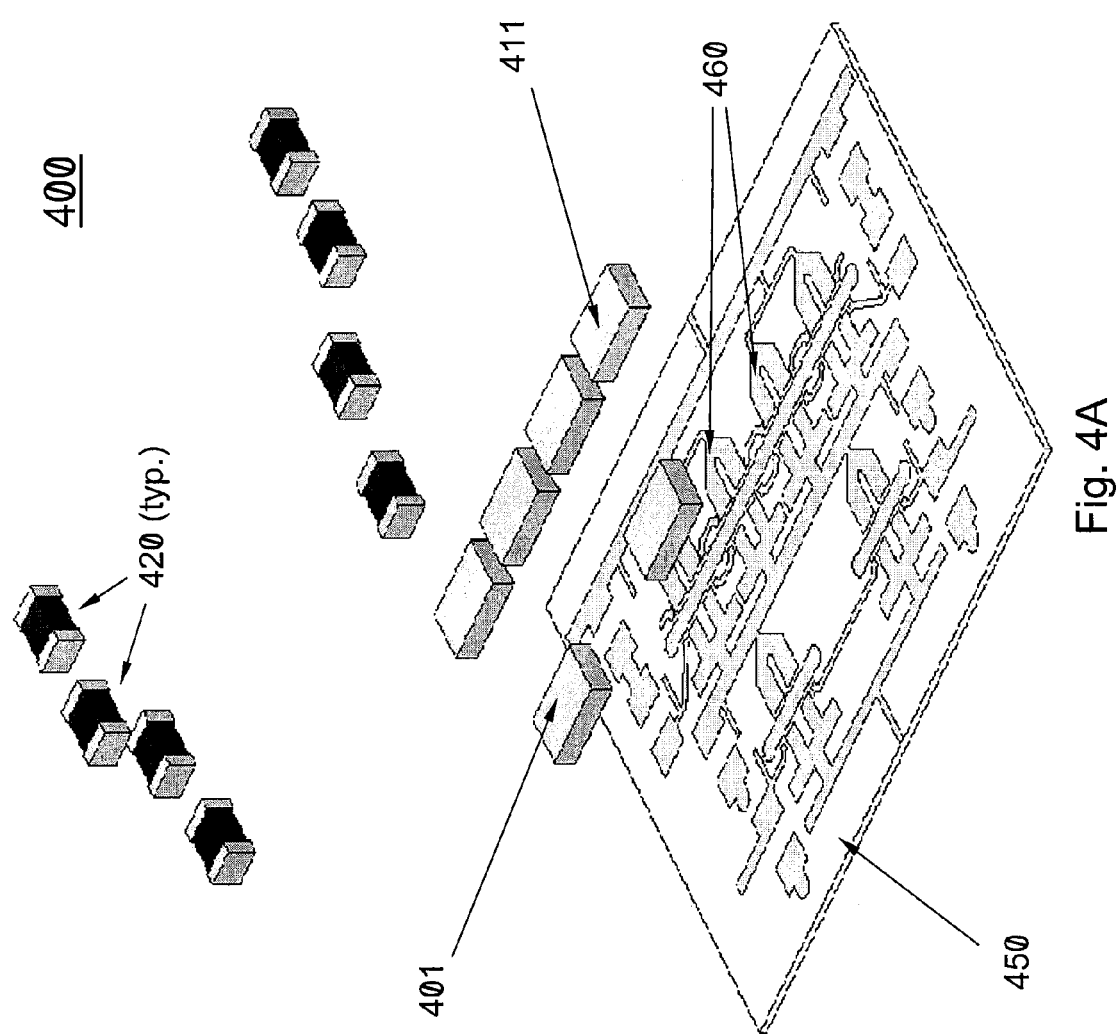

ELECTRONIC SYSTEM HAVING FIELD EFFECT TRANSISTORS AND INTERCONNECT BUMPS ON A SEMICONDUCTOR SUBSTRATE

FIELD OF INVENTION

The application relates to systems, devices, and methods for a field effect transistor (FET) cell connecting to a substrate via flip-chip technology. More particularly, the application relates to a FET cell electrically communicating with a matching structure on a separate substrate via a flip-chip connection.

BACKGROUND OF THE INVENTION

At high operating frequencies, field effect transistor (FET) devices are typically manufactured on substrate material of gallium arsenide (GaAs) or gallium nitride (GaN). Though other materials may be used, GaAs or GaN is a higher quality material designed and controlled to provide good performance of FET devices. However, in addition to being higher quality materials than the other possible materials, GaAs and GaN are also more expensive and more difficult to manufacture. Unfortunately, in the typical chip configuration, the majority of the chip area includes integrated passive components, such as a matching structure. These passive components do not benefit from the higher quality substrate material, resulting in inefficient use of the chip layout.

With reference to prior art FIG. 1, a typical die 100 comprises a substrate 101 having active components and passive components. In an exemplary embodiment, die 100 is a monolithic microwave integrated circuit ("MMIC"). For example, die 100 may comprise a MMIC used in a power amplifier. Most of the space on die 100 is taken up by the passive components, such as a matching structure 110 and/or some interconnect features. A lesser amount of space is covered with active components, such as FET devices 120 located in areas designated by reference number 121. In the embodiment illustrated in FIG. 1, the areas 121, containing active FET devices 120, consume less than 10% of the area of die 100, and passive components cover the remaining area.

The FET devices 120 of FIG. 1 may comprise interdigital FETs common to those skilled in the art or folded FETs. The FET devices 120 and matching structure 110 are typically on the same substrate 101, as shown here. Integrating matching structure 110 on the same substrate as FETs 120 has the benefit of reducing associated parasitics and removing any interface between the FET and the corresponding integrated matching structure. This results in a high level of repeatability, which is necessary at high frequencies of operation. The high repeatability is desirable in order to achieve required performance levels and reduce the need to tune the circuit. Similarly, circuit parasitics increase as the operating frequency of the circuit increases. Thus, the prior art teaches towards integrating the matching structure and other functionality onto the MMIC (i.e., onto a single substrate).

Furthermore, and with continued reference to prior art FIG. 1, typical GaAs substrate 101 is often thinned to enhance thermal performance and to provide improved microwave performance at high frequencies. Thinning substrate 101 for high frequency performance is often used to prevent higher order mode propagation. For example, preventing propagation in modes other than common quasi-TEM microstrip modes.

Additionally, in general chip designs, multiple transistors are manufactured on the same substrate. Due to the integrated nature of the transistors, if even one transistor on the chip does not work properly, then the entire chip is compromised and cannot be used. Various types of transistors have different manufacturing success rates, referred to as the yield. Since multiple transistors are manufactured on the same substrate, the overall yield (also referred to as the rolled yield) of the substrate is the joint probability of producing N good FETs simultaneously on the same chip. In other words, if the probability of producing a single good FET is 99%, then the probability of producing a chip having N good FETs is $0.99^N$. For example, the probability of producing a chip with 46 good FET devices at this yield is $0.99^{46}=63\%$. In many cases, the individual yield for a particular type of FET is less than 99%. As one can appreciate, as the number of FETs on a chip increases, the probability of producing a working FET device decreases. The rolled yield issue can significantly limit the size and complexity of circuits, especially if the individual FET yield is lower than 99% by only a few percentage points.

Thus, a need exists for improved chip layouts and designs which result in more efficient use of the chip space for active components. Furthermore, a need exists for avoiding rolled yield issues when integrating large number of FETs in a complex circuit.

SUMMARY OF THE INVENTION

In an exemplary embodiment, a FET cell includes multiple individual transistors and interconnect bumps that are configured to flip-chip connect to a substrate. The substrate has the majority of a matching structure for the FET cell. Furthermore, the FET cell includes a stability circuit in communication with the terminals of the individual transistors and further in communication with the interconnect bumps.

An advantage to having a FET cell and a separate substrate for the majority of the matching structure is that different materials can be used in combination. Various materials may be more efficiency used in a FET cell, while other materials are suitable for the separate substrate. Different considerations for selecting the materials include thermal conductivity, manufacturability and cost.

Furthermore, in order to avoid rolled yield issues, multiple FET cells may be used in an electronic system. The FET cells can be individually tested and discarded in the case of non-compliant or defective FETs. By using multiple FET cells and taking a modular approach to system assembly, a higher overall yield results. In an exemplary embodiment, the electronic system may be at least one of a power amplifier, mixers, low noise amplifiers, switches, variable attenuators or phase shifters, or other suitable devices using multiple transistors.

BRIEF DESCRIPTION OF THE DRAWING FIGURES

A more complete understanding of the present invention may be derived by referring to the detailed description and claims when considered in connection with the drawing figures, wherein like reference numbers refer to similar elements throughout the drawing figures, and:

FIGS. 4A-4B illustrate an exemplary embodiment of a power amplifier system comprising multiple FET cells and a corresponding exploded view.

DETAILED DESCRIPTION

While exemplary embodiments are described herein in sufficient detail to enable those skilled in the art to practice the invention, it should be understood that other embodiments may be realized and that logical electrical and mechanical changes may be made without departing from the spirit and scope of the invention. Thus, the following detailed description is presented for purposes of illustration only.

In accordance with an exemplary embodiment, a FET cell comprising one or more FETs is configured to be flip-chip mounted to a substrate. In this exemplary embodiment, the FET cell comprises bumps for flip-chip mounting to the next higher assembly level. In various exemplary embodiments, at least some passive portions of a typical MMIC are moved off of the MMIC to the off chip substrate. In this exemplary embodiment, the FET cell primarily comprises active components.

Though described in terms of a field effect transistor ("FET") device, which includes MESFET (MEtal Semiconductor Field Effect Transistor), MOSFET (metal-oxide-semiconductor field-effect transistor), and JFET (junction gate field-effect transistor), the invention described herein may also apply to PHEMT (pseudomorphic high electron mobility transistor), MHEMT (metamorphic high electron mobility transistor), HBT (heterojunction bipolar transistor) or any other active device types. Furthermore, the transistors may be n-type or p-type.

Figure 1:
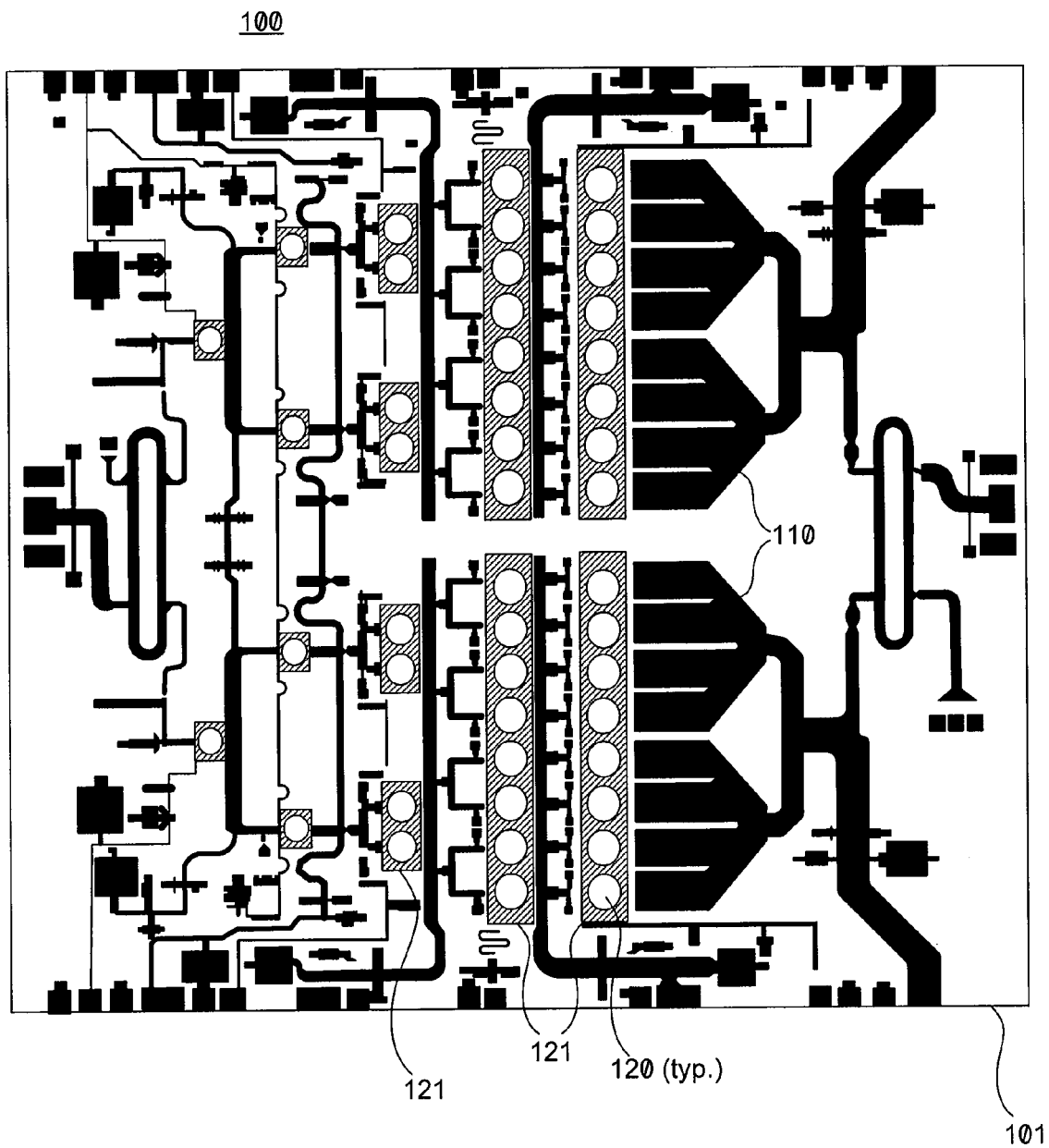
FIG. 1 illustrates a prior art MMIC on a single substrate.
Figure 2:
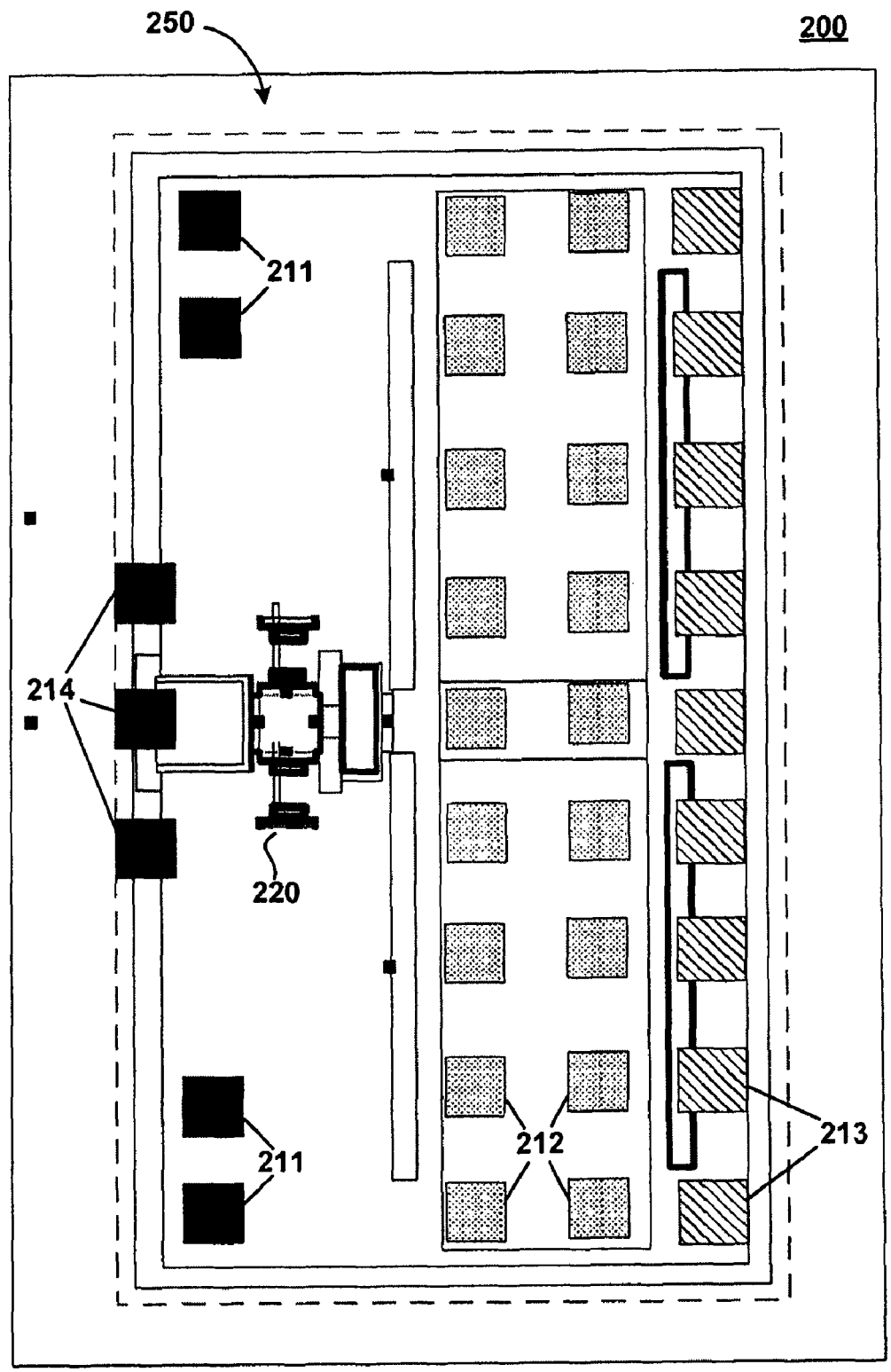
FIG. 2 illustrates an exemplary embodiment of a FET cell.

In accordance with an exemplary embodiment of the present invention and with reference to FIG. 2, FET cell 200 comprises multiple FET devices on a chip. As mentioned above, the FET devices may comprise folded FETs. These folded FETs may be such as are described in U.S. Pat. No. 6,388,528, entitled "MMIC Folded Power Amplifier" and U.S. Pat. No. 6,362,689, entitled "MMIC Folded Power Amplifier" with common inventor to the present application, and which are incorporated herein by reference in their entirety. In accordance with an exemplary embodiment, the FET cell may comprise FET devices with 2 or more interdigital fingers. The preferred embodiment comprises two FET devices each with 8 interdigital fingers. In another exemplary embodiment, the FET cell may comprise 2-24 finger or 8-16 finger FETs. Other numbers of FETs may be used as suitable for the application of the FET cell. In accordance with various exemplary embodiments, the FET cell may comprise several (e.g. 8-16 finger) FETs.

Additionally, in an exemplary embodiment, FET cell 200 further comprises conductive bumps. FIG. 2 illustrates a top view of the FET cell surface and conductive bumps. The conductive bumps are configured to provide contact points to facilitate connection to the next higher assembly level. In one exemplary embodiment, FET cell 200 comprises a gate interconnect bump 211, a source interconnect bump 212, and a drain interconnect bump 213. The number of such bumps may vary depending on the design of FET cell 200. For example, in one exemplary embodiment four gate interconnect bumps 211, eighteen source interconnect bumps 212, and nine drain interconnect bumps 213 are used. In an exemplary embodiment, the bumps may be approximately 65 µm square. In other exemplary embodiments, the bumps may be any suitable size and shape. The layout of the bumps may similarly vary depending on design constraints of the next higher assembly level and of FET cell 200 itself.

In an exemplary embodiment, FET cell 200 has a surface area defined by the area of the planar surface of the device. In an exemplary embodiment, the surface area is about 1 mm$^2$. In other exemplary embodiments, the size and dimensions of the device may be any suitable size and dimensions. In an exemplary embodiment, a much larger fraction of the surface area of the device is occupied by FET devices, interconnect bumps, interconnects, or other active components. In another embodiment, at least 50% of the chip is occupied by the FET devices and related components. In accordance with another exemplary embodiment, FET cell 200 comprises a range of 20%-90% that is occupied by active components. The active components part of the FET includes the drain and source fingers along with their interconnect pads. Furthermore, in an exemplary embodiment the active components also include the appropriate spacing between FET terminals. For example, the spacing may be about 60-90 µm surrounding the FET fingers.

In accordance with an exemplary embodiment, the size of the conductive bumps may be greater than individual FET vias. In this exemplary embodiment, the individual FETs may be spaced farther apart than would typically be done in a prior art MMIC in order to accommodate the layout of the conductive bumps. Although this takes up more device surface area, this accommodation can be afforded due to surface area savings by moving some passive elements off of the device. In another exemplary embodiment, the size of FET cell surface area is dependent on manufacturing constraints as would be known to one skilled in the art. Furthermore, such spacing may also provide improved thermal performance.

By way of example, though by no means limiting, a specific FET cell 200 is illustrated in FIG. 2. In this example, FET cell 200 has substrate dimensions of about 800 µm by 1300 µm. A total FET periphery of about 1.4 mm is shown, though the amount of periphery can vary. In an exemplary embodiment, the FETs of FET cell 200 are located within 10% of the FET periphery. Furthermore, in the example the conductive bumps are square with a length of approximately 65 µm. As illustrated in the example, FET cell 200 comprises eighteen source conductive bumps, nine drain conductive bumps, and four gate conductive bumps. In another embodiment, the conductive bumps are rectangular, or comprise rounded edges.

Figure 3:
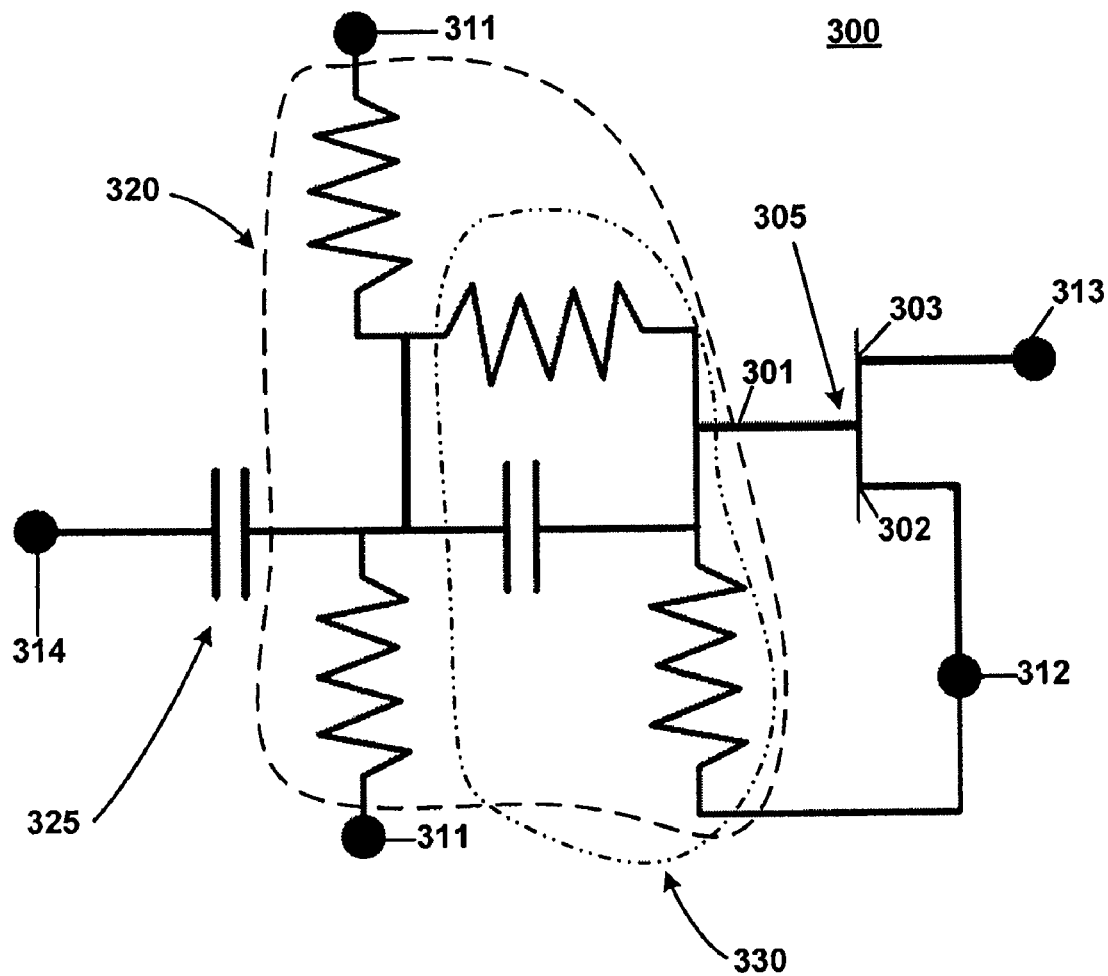
FIG. 3 illustrates a schematic of an exemplary FET and interconnect bumps.

In an exemplary embodiment, FET cell 200 further comprises a stability circuit 220. An exemplary schematic of stability circuit 220 is illustrated in with reference to FIG. 3. In various embodiments, FET cell 300 comprises a stability circuit 320. Stability circuit 320 may further comprise a gate stability circuit 330 which may comprise, for example, the two resistors and capacitor connected to gate 301. In various embodiments, FET cell 300 comprises at least one FET 305. In accordance with the exemplary embodiment, a FET cell 300 comprises a gate 301, a source 302, and a drain 303, and a gate interconnect bump(s) 311, a source interconnect bump 312, and a drain interconnect bump 313. FET cell 300 may further comprise a signal input bump 314. In accordance with an exemplary embodiment, gate 301, source 302, and drain 303 are interconnected and routed to gate interconnect bump 311, source interconnect bump 312, and drain interconnect bump 313, respectively. These connections serve to provide parallel electrical connections of individual FET fingers and an electrical connection to the interconnect bumps. In various embodiments, FET cell 200 comprises a semiconductor substrate 250.

In an exemplary embodiment, stability circuit 220 is connected between the gate and source terminals of FET cell 300 and the corresponding interconnect bumps. Furthermore, in another exemplary embodiment, FET cell 300 further comprises some matching components positioned in proximity to gate 301. Positioning some matching components near gate 301 allows wider bandwidth to be achievable once the remaining matching structure is added.

For example, stability circuit 220 comprises a resistor between gate 301 and source 312, a resistor and capacitor in parallel with each other between gate 301 and a node, resistors between that node and gate interconnects 311, and another capacitor between signal input bump 314 and that node. In an exemplary embodiment, stability circuit may be a parallel R-C network. Furthermore, any stability circuit 220 may be used that is configured to provide unconditional stability for the FET device and substantially reduce low frequency out-of-band gain which may cause problematic oscillation or unwanted spurious performance.

In accordance with further exemplary embodiments, FET cell 200 comprises some passive elements. In particular, some passive elements work better when near the FETs. For example, FET cell 200 may comprise an input DC block (see also DC block 325 on FIG. 3). FET cell 200 may further comprise DC bias circuitry, and interconnect features. In an exemplary embodiment, FET cell 200 comprises gate bias connections configured to provide interconnection to additional similar FET cells in a parallel "daisy chained" fashion. Similarly, daisy chained connections facilitate drain mode suppression resistors. In an exemplary embodiment, the suppression resistors help to suppress and dissipate odd-mode energy that may arise from small asymmetries in response to combining multiple FETs in parallel.

In another exemplary embodiment, FET cell 200 does not comprise any matching structure. Thus, a large percentage of the area of FET cell 200 is available in an embodiment where no matching structure is on FET cell 200. In this exemplary embodiment, all of the matching structure circuitry is located off-chip, for example on another substrate. In accordance with an exemplary embodiment, the matching structure comprises lumped or distributed element matching for the purpose of providing an impedance match to the FET cell. The matching structure may include, in an exemplary embodiment, capacitors, inductors, transmission lines or other suitable impedance matching elements. In one exemplary embodiment, the matching structure comprises just the output power matching and combining network.

In yet another exemplary embodiment, FET cell 200 comprises some matching structure, but not all of the matching structure that is associated with the FETs of FET cell 200. In an exemplary embodiment, matching structure circuitry is present between an interconnect bump and a FET terminal on FET cell 200. However, the majority of the matching and interconnection structures for FET cell 200 are located on another substrate. In one embodiment, the majority of the matching structure is defined in terms of the area of the matching structure. In a second embodiment, the majority of the matching structure is defined in terms of the overall impendence transformation. Furthermore, in an exemplary embodiment, substantially all of the interconnections between FET cell 200 and the associated matching structure, power combining and power splitting are done on another substrate.

As mentioned above, in an exemplary embodiment, FET cell 200 is attached to this other substrate using flip-chip technology. Flip-chip technology involves assembling electronic components in a face-down configuration onto substrates, circuit boards, or other components. In an exemplary embodiment, the connection between the electronic components and a substrate is through the interconnect bumps. In an exemplary embodiment, the interconnect bumps are made of gold or solder. Furthermore, other materials may be used for the interconnect bumps. In contrast, in accordance with an exemplary embodiment FET cell 200 is not attached to the next higher assembly layer substrate using wire bonds. Wire bonds use a wire connection between components in a face-up configuration.

In a flip-chip connection, also referred to as Direct Chip Attach (DCA), the electronic components (e.g., a chip) are directly connected to the substrate without traditional wirebonding. Accordingly, FET cell 200 is flipped and attached to another substrate that is configured to facilitate matching, biasing, and providing an interconnection. In an exemplary embodiment, FET cell 200 is reflow attached to a substrate. In another exemplary embodiment, FET cell 200 is configured for being picked-and-placed during the assembly process using surface-mount technology (SMT). In an exemplary embodiment, a system (such as a power amplifier system) can be manufactured using a fully surface mounted assembly process at least in-so-far as the FET cell 200 is concerned. Thus, in various exemplary embodiments, FET cell 200 is configured so as to eliminate the chip and wire process, which reduces overall assembly costs significantly and improves repeatability of the assembly process.

As previously discussed, GaAs substrates are typically thinned to enhance thermal performance and to provide improved microwave performance at high frequency. In an exemplary embodiment, connecting a FET cell and a substrate using flip-chip technology eliminates the need to thin the substrate or provide electrical vias through the GaAs substrate for groundings because all the interconnect is done through the interconnect bumps. Furthermore, in an exemplary embodiment the substrate, onto which the FET cell is connected, is configured to control and determine the propagating modes in the interconnecting media. Eliminating the need to thin wafers for thermal and high frequency electrical performance further reduces the complexity and cost of manufacturing the FET cells compared to conventional prior art MMICs.

Figure 4B:
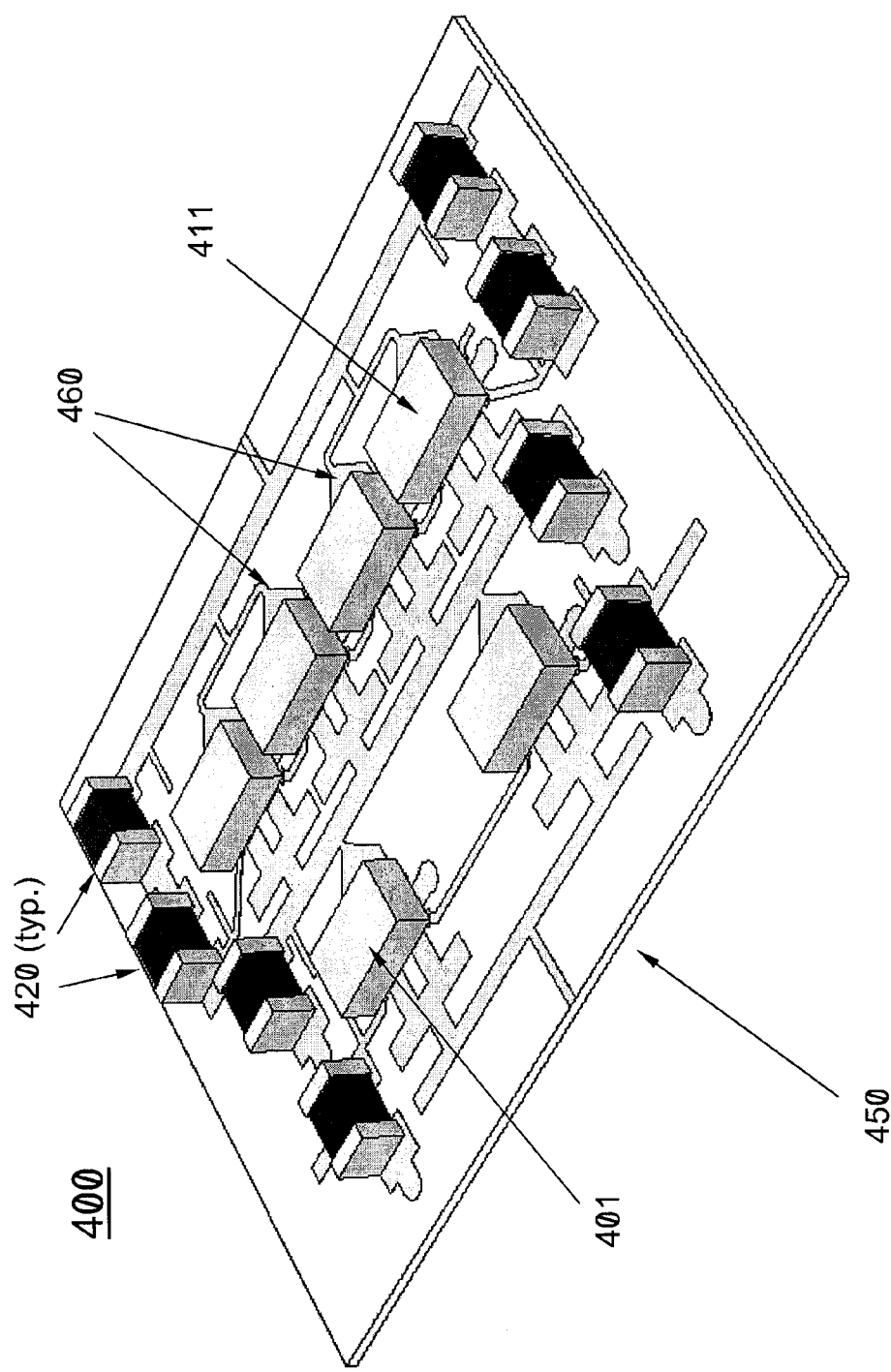

In accordance with an exemplary embodiment and with reference to FIGS. 4A and 4B, a power amplifier system 400 comprises a first FET cell 401, a second FET cell 411, and a substrate 450. Substrate 450 may also be called a printed circuit board substrate. In another exemplary embodiment, power amplifier system 400 further comprises at least one capacitor 420, which may be a standard surface mount capacitor. In an exemplary embodiment, FET cells 401, 411 attach directly on top of substrate 450 having a matching structure 460. The FET cells 401, 411 may be mounted to substrate 450 such that the FET cells are in the same plane as each other, but in a different plane from the substrate 450. The FET cells may further be mounted in planes that are parallel to the plane of substrate 450. In an exemplary embodiment, the number of transistors in FET cell 401 may be the same or different than the number of transistors in FET cell 411. Also, the type of transistor in FET cell 401 could be different than in FET cell 411. Moreover, the number of FET cells used in a particular power amplifier system 400 can vary. FIGS. 4A and 4B show two such FET cells, but the number of FET cells connected to system 400 could be any number greater than two. In various designs, an increase in performance and efficiency may be realized by implementing different sizes or types of FET cells. However, implementing just one or two sizes or types of FET cells may result in economical manufacturing benefits due in part to economies of scale.

In an exemplary method, an integrated circuit design uses a particular number of transistors. For example, a power amplifier design may use four FET cells in parallel to reach a desired power level of 2 Watts and may use four gain stages to reach a desired gain level of 25 dB. In this example the first and second stages may use only one FET cell while the third stage uses two FET cells in parallel and the last stage uses four FET cells in parallel. The required transistors may be contained in a single FET cell or in multiple FET cells. In addition to the number of transistors, the spacing of an IC design is also taken into consideration. As an example, if 64 transistors are needed in an IC, a single FET cell having 64 or more transistors could be used. However, three FET cells having 24 transistors each could also be used, leaving some transistors unused in the final device.

In accordance with one method of manufacturing an electronic device, the electronic device is made by selecting and attaching FET cells from a standard supply of FET cells. This may result in cost effective manufacturing. Furthermore, this may be useful in low volume manufacturing or in testing of new designs. For example, in such embodiments, only the substrate would need to be designed, and a considerable savings can be obtained in time and expense from omitting the process of designing a custom MMIC and the substrate. In various exemplary embodiments, it may be more cost effective to use the same type of FET cell throughout the IC.

Furthermore, in an exemplary embodiment, an IC design is configured to have favorable yield numbers by implementing a modular approach of adding FET cells to the device. In one exemplary embodiment, the number of FETs in each cell is limited to improve the rolled yield as compared to the rolled yield of a device that has all the FETs in a single MMIC. In an exemplary embodiment, instead of printing an entire complex circuit on a single substrate, the design is broken down into modular FET cells. In this exemplary embodiment, multiple FET cells are used, and if one transistor fails, only that FET cell is thrown out instead of the entire integrated circuit. In one embodiment, FET cells are tested for compliance prior to attachment to the substrate. In a second embodiment, a non-compliant FET cell can be removed from the substrate after initial attachment.

In accordance with another exemplary embodiment, advantage is taken of using materials better suited for the use to which they are put. For example, in accordance with an exemplary embodiment, one type of material is used for the FET cell and a different type of material is used for the separate substrate to which the FET cell is attached.

In an exemplary embodiment, FET cell 200 is manufactured on a gallium arsenide (GaAs) or gallium nitride (GaN) substrate. Other materials may also be used. As previously described, these types of substrates have quality performance characteristics important if operating the FET devices at a high frequency. The FET device may be considered to be high frequency if the signal carried at signal input 314 is a high frequency signal or high frequency radio frequency ("RF") signal. In an exemplary embodiment, high frequency means millimeter wave frequency or higher. In one exemplary embodiment, high frequency means 20 GHz or higher. In another exemplary embodiment, a high frequency is 15 GHz and above. In another exemplary embodiment, a high frequency is in the range of 15 GHz to 45 GHz.

In contrast, the passive components, such as the matching structure, may be produced in connection with any suitable different substrate material. To be more specific, in one exemplary embodiment, passive components may be moved to a substrate comprising a material that is not GaAs or GaN. In an exemplary embodiment, a suitable substrate material includes at least one of aluminum nitride (AlN), alumina, or low temperature co-fired ceramic ("LTCC"). Such materials might be used in thin film substrates. Thin film substrates may employ gold thermo-sonic bump attach methods. In another exemplary embodiment, a suitable substrate material might include ceramic materials or Teflon based circuit board materials such as Rogers RO4003. Such materials might be used in connection with standard printed circuit boards ("PCBs"). Standard PCBs may use solder reflow as a means of attachment. Moreover, other suitable substrate materials may be used as would be known to one skilled in the art.

In an exemplary embodiment, an electronic device comprising a substrate and a flip-chip connected FET cell is configured to improve thermal conductivity. In one embodiment, the substrate material contributes to the improved thermal conductivity. For example, AlN substrates have improved thermal conductivity in comparison to GaAs. In accordance with an exemplary embodiment, substrate 450 is selected to have favorable heat transfer qualities. Thus, in one exemplary embodiment, substrate 450 comprises aluminum nitride (AlN). Furthermore, substrate 450 may comprise any material that favorably transfers heat away from FET cells 401, 411. In addition, the matching structure material may be selected to favorably transfer heat away from FET cells 401, 411.

In another embodiment, the layout of FET cells contributes to the improved thermal conductivity. In accordance with an exemplary embodiment, FET cell 200 is configured to improve thermal performance by spreading out at least some of the FETs on the FET cell 200. Spacing FET cells within an electronic device farther apart than in prior integrated circuits may result in improved thermal performance because the FET devices have less thermal interaction with each other resulting in less mutual heating. Also, the additional substrate area for heat transfer results in lower total thermal resistance. This can be done without an increase in the FET cell size because of offsets in the size when removing some passive components from the FET cell.

The exemplary embodiments described herein may be implemented in various devices and systems. A typical power amplifier will comprise 9-16 finger FETs, leading to rolled yield issues in a typical design. In an exemplary embodiment and with reference to FIG. 4, a power amplifier 400 is designed and produced using FET cells 401 and 411. In another exemplary embodiment, power amplifier 400 comprises a substrate with a power supply, a MMIC which is coupled to the substrate and having an RF input and RF output, and a matching structure coupled to the RF output of the MMIC. The MMIC flip-chip connects to the substrate, such that the MMIC is electrically connected to the power supply. In accordance with an exemplary embodiment, bias injection structures are formed on the PCB.

In addition to a power amplifier, FET cells may also be effectively used in mixers, low noise amplifiers, switches, variable attenuators or phase shifters, as well as other suitable devices as would be known to one skilled in the art. Furthermore, in an exemplary embodiment, FET cells are applied in prototyping and initial testing of circuit designs. Yet another advantage of applying FET cells to a circuit is that custom products may be created based upon a substrate design instead of a full MMIC design.

In an exemplary embodiment, a FET cell is designed using standard MMIC models and layout techniques. The FET cell is stabilized and partially matched for the band of interest. The FET cell is then fabricated and characterized for use in multiple applications. Once characterized, the FET cell is then used along with its standard footprint to design the substrate for interconnect, matching and bias injection in the same way as those structures would be designed on a GaAs substrate. Furthermore, in an exemplary embodiment, the FET cell is tested and is properly functioning prior to attachment to a next higher assembly level.

Although not necessarily so limited, the invention described herein is likely to be most practically useful in high frequency devices such as devices configured to operate at or above the millimeter frequency range. In addition, the system, methods and devices disclosed herein are likely to be of greatest value where rolled yield of a MMIC is less than 80%. In various embodiments, the rolled yield of the electronic system is 90% or greater when the yield of individual FETs is less than 97%, and the number of total FETs is at least four. In addition, that disclosed herein may be of greatest value where the cost per unit area of the FET carrying substrate is significantly less than the cost per unit area of a substrate suitable for passive structures. For example, significantly less might be on the order of 50% less. To characterize another way, in an exemplary embodiment, the FET carrying substrate may cost 100 to 1000 times more per area than a substrate suitable for passive structures. As an example, GaAs MMIC device area may typically cost $1-$5 per square mm while Rogers RO4003 may cost less than 0.1 cents per square mm. As a further example, ceramic substrates such as AlN or Alumina may cost in the range of 1 to 5 cents per square mm.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as critical, required, or essential features or elements of any or all the claims. As used herein, the terms "includes," "including," "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Further, no element described herein is required for the practice of the invention unless expressly described as "essential" or "critical."

What is claimed is:

1. An electronic system comprising:
a plurality of field effect transistor (FET) cells, each FET cell further comprising:
a plurality of FETs, each comprising terminals, wherein the plurality of FETs are located on a semiconductor substrate;
a direct current (DC) block on the semiconductor substrate;
a gate interconnect bump on the semiconductor substrate;
a source interconnect bump on the semiconductor substrate;
a drain interconnect bump on the semiconductor substrate, wherein the gate, source and drain interconnect bumps are configured to flip-chip connect the plurality of FET cells to a printed circuit board (PCB) substrate; and
a stability circuit, wherein the stability circuit is in communication with each of the gate, and drain interconnect bumps;
wherein the stability circuit further comprises a gate stability circuit;
the PCB substrate comprising a matching structure in communication with at least one of the gate interconnect bump or drain interconnect bump, wherein the matching structure on the PCB substrate comprises distributed matching elements; and
wherein at least two of the plurality of FET cells are connected in parallel to form parallel FET cells, and wherein the parallel FET cells comprise daisy chained gate bias interconnections between the two FET cells.

2. The electronic system of claim 1, wherein the semiconductor substrate comprises one of a GaAs or GaN material, and wherein the PCB substrate does not comprise either GaAs or GaN material.

3. The electronic system of claim 2, wherein the semiconductor substrate comprises a thin film substrate.

4. The electronic system of claim 1, wherein a rolled yield of the electronic system is 90% or greater when a yield of individual FETs is less than 97%, and the number of total FETs is at least four.

5. The electronic system of claim 1, wherein at least 50% of the area of the plurality of FET cells is covered by the plurality of FETs, the stability circuit, and the gate, source and drain interconnect bumps.

6. The electronic system of claim 1, wherein there is no matching structure on the plurality of FET cells.

7. The electronic system of claim 1, wherein the semiconductor substrate is in a first plane and the PCB substrate is in a second plane that is not coplanar with the first plane, and wherein the first and second planes are in parallel with each other when connected.

8. The electronic system of claim 1, wherein the semiconductor substrate comprises a first material and the PCB substrate comprises a second material, and wherein the first material is different than the second material.

9. The electronic system of claim 1, wherein the gate, source, and drain interconnect bumps are configured to directly connect to a matching structure on the PCB substrate.

10. An electronic system comprising:
a plurality of field effect transistor (FET) cells, each FET cell further comprising:
a plurality of FETs, each comprising terminals, wherein the plurality of FETs are located on a semiconductor substrate;
a direct current (DC) block on the semiconductor substrate;
a gate interconnect bump on the semiconductor substrate;
a source interconnect bump on the semiconductor substrate;
a drain interconnect bump on the semiconductor substrate, wherein the gate, source and drain interconnect bumps are configured to connect the plurality of FET cells to a printed circuit board (PCB) substrate; and
a stability circuit, wherein the stability circuit is in communication with each of the gate, and drain interconnect bumps;
the PCB substrate comprising a matching structure in communication with at least one of the gate interconnect bump or drain interconnect bump.

11. The electronic system of claim 10, wherein the matching structure on the PCB substrate comprises distributed element matching.

12. The electronic system of claim 10, wherein the stability circuit further comprises a gate stability circuit.

13. The electronic system of claim 10, wherein at least two of the plurality of FET cells are connected in parallel to form parallel FET cells, and wherein the parallel FET cells comprise daisy chained gate bias interconnections between the two FET cells.

14. The electronic system of claim 10, wherein the semiconductor substrate comprises one of a GaAs or GaN material, and wherein the PCB substrate does not comprise either GaAs or GaN material.

15. The electronic system of claim 10, wherein a rolled yield of the electronic system is 90% or greater when a yield of individual FETs is less than 97%, and the number of total FETs is at least four.

16. The electronic system of claim 10, wherein at least 50% of the area of the plurality of FET cells is covered by the plurality of FETs, the stability circuit, and the gate, source and drain interconnect bumps.

17. The electronic system of claim 10, wherein there is no matching structure on the plurality of FET cells.

18. The electronic system of claim 10, wherein the semiconductor substrate is in a first plane and the PCB substrate is in a second plane that is not coplanar with the first plane, and wherein the first and second planes are in parallel with each other when connected.

\* \* \* \* \*